United States Patent [19]
Ikalainen

[11] Patent Number: 5,365,197
[45] Date of Patent: Nov. 15, 1994

[54] LOW-NOISE DISTRIBUTED AMPLIFIER

[75] Inventor: Pertti K. Ikalainen, Allen, Tex.

[73] Assignee: Texas Instruments Incorporated, Dallas, Tex.

[21] Appl. No.: 86,281

[22] Filed: Jun. 30, 1993

[51] Int. Cl.$^5$ .............................................. H03F 3/60
[52] U.S. Cl. ..................................... 330/286; 330/295
[58] Field of Search ................... 330/53, 54, 277, 286, 330/295, 307

[56] References Cited

U.S. PATENT DOCUMENTS 4,733,193  3/1988  Tserng et al. ...................... 330/286

FOREIGN PATENT DOCUMENTS 4123437  1/1993  Germany .............................. 330/54

OTHER PUBLICATIONS

Colin S. Aitchison, "The Intrinsic Noise Figure of the MESFET Distributed Amplifier", *IEEE Transactions on Microwave Theory and Techniques*, vol. MTT-33, No. 6, Jun. 1985, pp. 460–466.

Kark B. Niclas, "Active Matching with Common-Gate MESFET's", *IEEE Transactions on Microwave Theory and Techniques*, vol. MTT-33, No. 6, Jun. 1985, pp. 492–499.

Robert L. Forward and Terry C. Cisco, "Electronically Cold Microwave Artifical Resistors", *IEEE Transactions on Microwave Theory and Techniques*, vol. 31. No. 1, Jan. 1983, pp. 45–50.

*Primary Examiner*—Steven Mottola
*Attorney, Agent, or Firm*—Michael K. Skrehot; James C. Kesterson; Richard L. Donaldson

[57] ABSTRACT

In one form of the invention, an amplifier is disclosed, the amplifier comprising: an input transmission line 32; an output transmission line 36,38; at least two active devices 134 distributed between the two transmission lines; a termination 50 connected to an end of the input transmission line 32, the termination 50 comprising a terminating transistor 52 having a first gate terminal 150, a drain terminal 151, and a source terminal 152. wherein the first gate terminal 150 is connected to the input transmission line 32 and the drain terminal 151 is coupled to the first gate terminal 150 through a resistor 58 and a capacitor 56. The termination 50 is preferably characterized by a noise temperature of less than 300° K.

20 Claims, 4 Drawing Sheets

Fig. 2

LOW-NOISE DISTRIBUTED AMPLIFIER

FIELD OF THE INVENTION

This invention generally relates to electronic devices, and more particularly to microwave distributed amplifiers.

BACKGROUND OF INVENTION

The availability of high-gain, high-frequency microwave transistors has revived the old "distributed" or "travelling-wave" approach for broadband microwave amplification. However, instead of electron tubes, these amplifiers employ transistors such as GaAs Field Effect Transistors (FETs). These transistors are ideal active elements for distributed amplifiers in that the intrinsic gate and drain capacitances serve as parts of the shunt elements of two artificial transmission lines: the gate and drain transmission lines. If the line element values (inductances) are chosen properly, wideband amplification can be obtained with more reasonable VSWRs than is possible for an FET having the same total gate width. In order to achieve this performance it is desirable to terminate the gate and drain transmission lines with the characteristic impedance of the lines. However, since the characteristic impedance of such a "constant-k" transmission line is a function of frequency, them is no physical combination of elements that can provide the ideal termination at all frequencies.

Active devices have been used to replace passive resistors in low-noise applications for many years. Recent implementations have made use of GaAs FETs. The transconductance ($g_m$) of an FET is defined as the ratio of the output (drain-source) signal current to the input (gate) signal voltage. When the drain of an FET is electrically coupled to the gate, the resulting two terminal device appears at signal frequencies as a resistor whose magnitude is equal to $1/g_m$. However, more importantly this active termination can achieve an equivalent noise temperature that is significantly colder than is possible with a resistor.

SUMMARY OF THE INVENTION

An advantage of the distributed amplifier is that a wide frequency bandwidth may be achieved with a relatively flat gain response. However, even if state of the art low noise devices are used for the amplification, a poor noise figure results at low microwave frequencies (less than about 6 GHz.) This poor noise figure is thought to be due primarily to the passive terminating network at the end of an input artificial transmission line. This is a limitation that the present invention is intended to address.

In one form of the invention, an amplifier is disclosed, the amplifier comprising: an input transmission line; an output transmission line; at least two active devices distributed between the two transmission lines; a termination connected to an end of the input transmission line, the termination comprising a terminating transistor having a first gate terminal, a drain terminal, and a source terminal, wherein the first gate terminal is connected to the input transmission line and the drain terminal is coupled to the first gate terminal through a resistor and a capacitor. The termination is preferably characterized by a noise temperature of less than 300° K.

In another form of the invention, a monolithic distributed amplifier is disclosed comprising: a semiconductor substrate having a top surface; at least two first field effect transistors formed at the top surface, the first transistors each having a first gate terminal, a first drain terminal, and a first source terminal; an input transmission line formed on the top surface, the input transmission line coupling an input terminal and a first termination, the first termination comprising a terminating transistor formed at the top surface and having a second gate terminal, a second drain terminal, and a second source terminal, and wherein the second gate terminal is coupled to the input transmission line and the second drain terminal is coupled to the second gate terminal through a resistor and a capacitor; an output transmission line formed on the top surface, output transmission line coupling an output terminal and a second termination; wherein the output transmission line is coupled to the first drain terminals, and the input transmission line is coupled to the first gate terminals. The first termination is preferably characterized by a noise temperature of less than 300° K.

An advantage of the invention is that it allows distributed amplifiers to achieve extremely wide bandwidth with a noise figure that is thought to be unattainable by conventional distributed amplifiers, particularly at low frequencies. In addition, this active load is electrically alterable by varying the direct current bias of the device to compensate for component variations which might occur during fabrication.

BRIEF DESCRIPTION OF THE DRAWINGS

Corresponding numerals and symbols in the different figures refer to corresponding parts unless otherwise indicated.

DETAILED DESCRIPTION OF PREFERRED EMBODIMENTS

Figure 1:
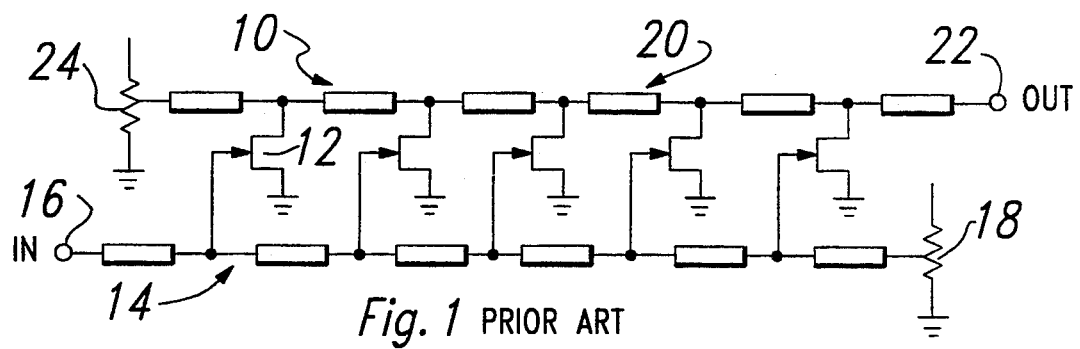
FIG. 1 is a schematic diagram of a prior art distributed amplifier.

A prior art travelling-wave amplifier, generally denoted 10, is schematically illustrated in FIG. 1 and includes FET devices 12 in common source connection, gate transmission line 14 which has input terminal 16 at one end and is terminated with matched termination impedance 18 at the other end, and drain transmission line 20 which has output terminal 22 at one end and is terminated with matched termination impedance 24 at the other end. Direct current for bias of FETs 12 is supplied through the termination impedance of the gate and drain transmission lines. An amplifier such as that shown in FIG. 1 is known to suffer from an undesirably high noise figure at frequencies below approximately 6 GHz. Applicant believes that the cause of this poor performance is the thermal noise generated in the passive resistor 18 typically used to terminate the gate transmission line 14.

Figure 2:
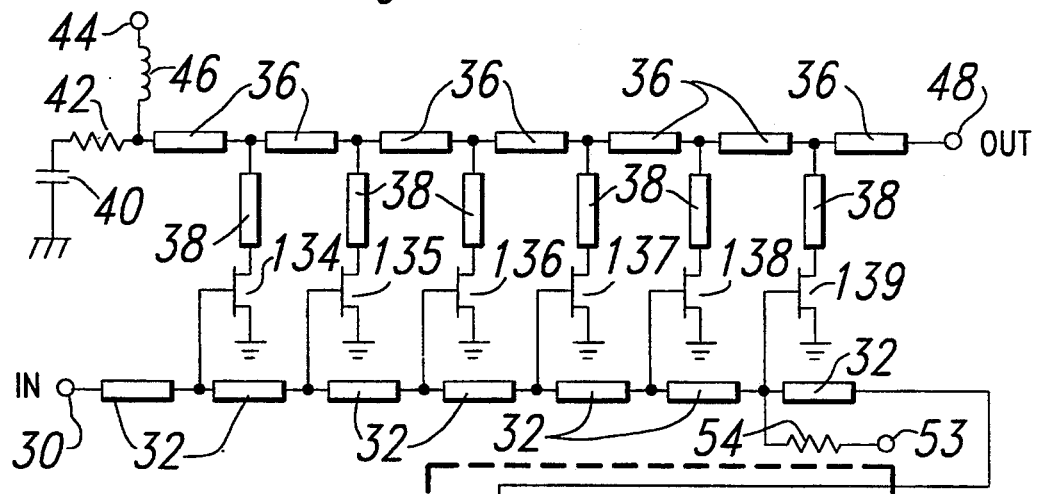
FIG. 2 is a schematic diagram of a first preferred embodiment amplifier.

A schematic diagram of a first preferred embodiment of the present invention is shown in FIG. 2. The operation of the embodiment amplifier is generally as follows. The low level signal to be amplified is applied at input terminal 30. The signal passes through microstrip transmission line segments 32 to the gates of FETs 134, 135, 136, 137, 138, 139. The segments 32 form an input transmission line and supply the gates of their associated FET 134, 135, 136, 137, 138, 139 with a delayed input signal to be amplified and coupled to the output transmission line formed in the drain circuits of FETs 134, 135, 136, 137, 138, 139 by transmission line segments 36 and 38. A bypass capacitor 40, typically approximately 10 pF, electrically grounds the transmission line through matching resistor 42 at high frequencies, while blocking the dc drain supply voltage $V_D$ applied at node 44 and isolated from the amplifier circuitry by a blocking inductance 46, typically approximately 10 nH. It should be noted that the drain bias applied at node 44 may be supplied to transistors 134, 135, 136, 137, 138, 139 in manners other than that shown in FIG. 2. For example, the bias current may be fed at a node between capacitor 40 and resistor 42, such that the bias current passes through resistor 42 in addition to inductor 46. Because resistor 42 is located on the amplified signal side of the circuit, there is little noise disadvantage to the use of a passive resistor, typically approximately 50 ohms.

The microstrip transmission line elements 36 coupled with the peaking elements 38 form an artificial transmission line of broad bandwidth to receive the amplified signals from FETs 134, 135, 136, 137, 138, 139 in a time-phased manner. The number of stages in the distributed amplifier is determined by the particular design requirements, and will likely vary from design to design. In general, an overly large number of stages can reduce overall gain and consumes a larger amount of the semiconductor surface area. At the opposite extreme, as the number of stages gets smaller, the amplifier gain response vs. frequency becomes less flat. Flat gain vs. frequency is usually a desired amplifier characteristic. Similarly, Applicant has found that the noise figure at the lower frequencies in the amplifier's operating range is very sensitive to the number of amplifier stages used. The noise figure increases substantially if too few stages are selected. However, Applicant has also found that this sensitivity is greatly reduced if an active termination is used to terminate the gate artificial transmission line, rather than a resistor (as with resistor 18 in FIG. 1).

The amplified output signal is taken from output terminal 48. Noise on the gate side transmission line is very important. An active termination, generally denoted 50, is used to produce the effect of a resistor whose thermally generated noise is much lower than a passive resistor at the operating ambient temperature. In this embodiment, the same gate voltage, $V_G$, that is applied at node 53 through resistor 54, typically approximately 2000 ohms, to FETs 134, 135, 136, 137, 138, 139 is also applied to the gate 150 of terminating transistor 52. Capacitor 56, typically approximately 5 pF, ties the signals at the drain 151 of transistor 52 to the gate 150 through resistor 58. The source 152 of transistor 52 is grounded. This converts the three terminal FET 52 into a two terminal network that functions as a resistor with a resistance of $1/g_m$. The transconductance, or $g_m$, of a transistor is determined largely by the selection of the gate periphery of the transistor, and by the gate voltage applied (see FIG. 4). In order to approximate an impedance of approximately 50 ohms, it follows that a $g_m$ of approximately 20 mS is desired. A low-noise GaAs HEMT (High Electron Mobility Transistor) having a gate periphery of 50 um and gate length of 0.25 um and biased at its lowest noise gate voltage (determined by experiment, typically between −2 V and 0.5 V) is used in this embodiment. However, a much larger gate periphery may be used which allows the transistor to be biased closer to the pinch off voltage (a more negative voltage). This configuration is discussed below as a second preferred embodiment, and may actually work better for the two-terminal low-noise termination.

The function of resistor 58 is primarily to assure the stability of the circuit, but by having a value near the characteristic impedance of the gate transmission line, typically between approximately 40 and 300 ohms (preferably approximately 230 ohms), it can also serve as a passive termination should the source and drain of transistor 52 be shorted as a result of catastrophic failure of transistor 52. It has been found that the value of this resistance affects noise at low frequency. For the particular active devices (HEMTs) used here, 230 ohms produces near optimal noise performance. It would most likely be different for other devices. The equivalent noise temperature of such an active termination can be less than the usual ambient operating temperature of 300 K. See R. L. Forward and T. C. Cisco, "Electronically Cold Microwave Artificial Resistors", IEEE Transactions on Microwave Theory and Techniques, vol. 31, no. 1, January, 1983. Applicants' simulations have shown an equivalent noise temperature of 200 K for an active termination using typical 0.25 um gate pseudomorphic GaAs HEMTs (HEMTs having a strained InGaAs channel layer). The resistors 60 and 62 form another stabilizing network that also sets the operating bias for transistor 52. These resistors have values that are typically about 300 and 500 ohms respectively. Drain voltage in the range of approximately 2 to 10 V, preferably about 3 V, is applied at node 61, and may be the same voltage as applied at node 44.

Figure 3:
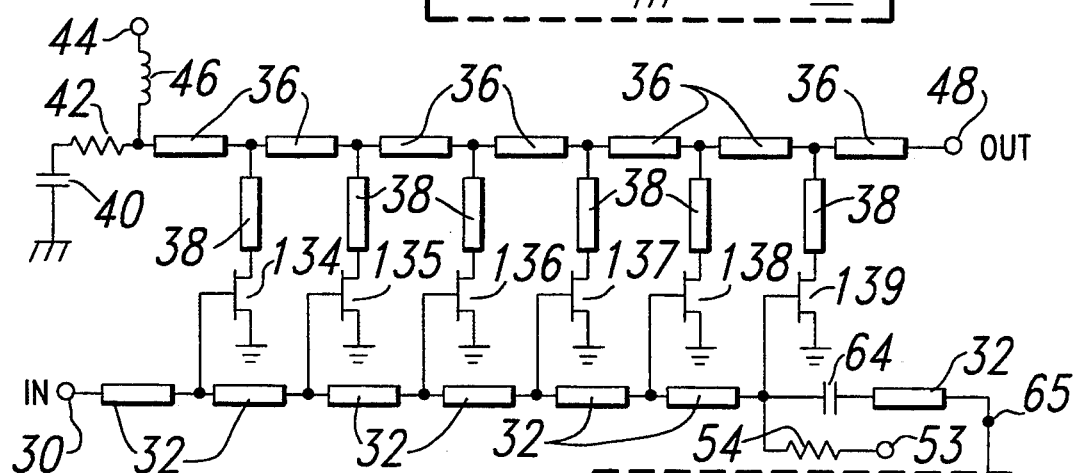
FIG. 3 is a schematic diagram of a second preferred embodiment amplifier.
Figure 4:
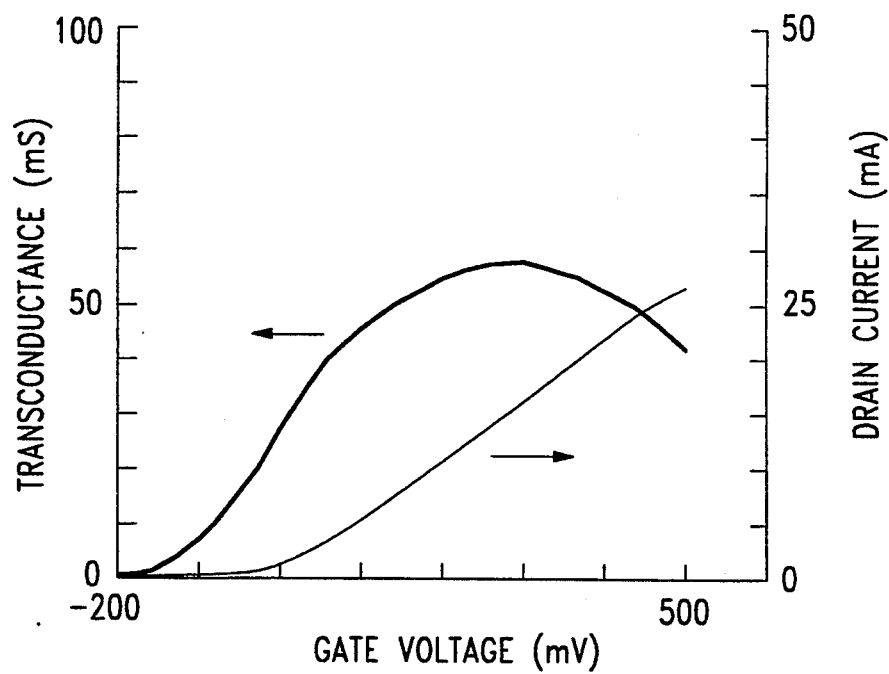
FIG. 4 is a plot of $g_m$ vs. $V_6$ for a HEMT.

In a second embodiment of the invention, schematically shown in FIG. 3, the dc gate biases $V_{G1}$ and $V_{G2}$ are independent. $V_{G1}$ is applied at node 53 and through resistor 54 provides gate bias to transistors 134, 135, 136, 137, 138, 139. $V_{G2}$ is applied at node 68 and through resistor 66 (typically about 1500 ohms) provides gate bias to transistor 52. DC blocking capacitor 64 isolates $V_{G1}$ from $V_{G2}$. One of the advantages of this arrangement is that $V_{G2}$ may be adjusted and optimized to achieve the lowest noise operating point for the terminating transistor 52, while allowing the designer the flexibility to choose a different operating bias point for the amplifying transistors 134, 135, 136, 137, 138, 139. This feature may also be important if process variation is sufficient to make it difficult to predict the performance of transistor 52. Additionally, Applicant has found that the noise performance of the amplifier benefits from having a lower current density in the terminating transistor 52 than in the amplifying transistor 134, 135, 136, 137, 138, 139. Consequently, a transistor 52 having a larger gate periphery (about 200 um vs. 50 um) is used. As in the first preferred embodiment, operation with the transistor 52 bias with a gate voltage near pinch-off has been shown to have beneficial effects on the noise figure of the amplifier as well. A curve of transconductance ($g_m$) vs. gate voltage ($V_G$) for a typical 75 um periphery, 0.25 gate width, InP low-noise HEMT is shown in FIG. 4. A 0.25 um gate width, 50 um gate periphery, GaAs pHEMT would have substantially the same $g_m$ vs. $V_G$ characteristics.

Figure 5:
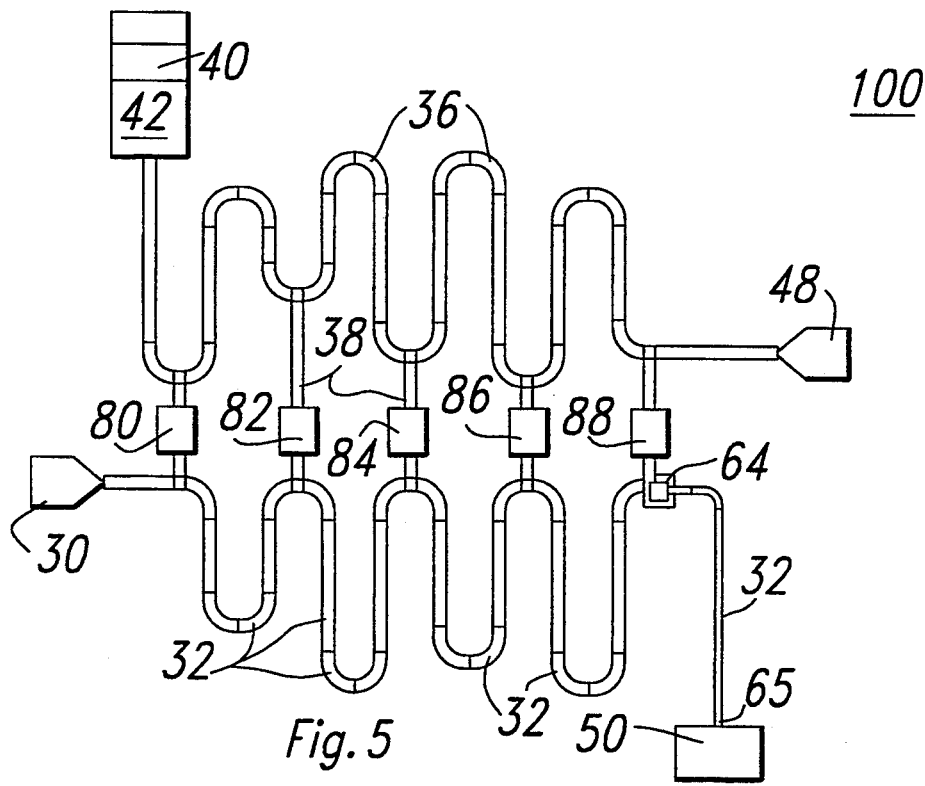
FIG. 5 is a plan view of a monolithic implementation of an embodiment amplifier.

The circuits shown schematically in FIGS. 1 and 2 may be fabricated as a monolithic integrated circuit. A sketch of a layout of a monolithic distributed amplifier is shown in FIG. 5. Elements are labelled to correspond to the schematic diagram of FIG. 3, where possible. An important feature of this circuit is that the relative gate periphery of each FET (shown as boxes 80, 82, 84, 86, 88) has been individually optimized. Distributed amplifiers in the past have typically used FETs of the same size (gate periphery). In this embodiment, the circuit is fabricated on a GaAs or InP substrate 100 using standard processing techniques. Using GaAs pseudomorphic HEMTs as the amplifying elements, the gate peripheries for transistors 80, 82, 84, 86, 88 were approximately 96 um, 74 um, 84 um, 80 um, and 56 um, respectively. As mentioned above the gate periphery size selection of the terminating transistor 52 depends on the bias voltage range and current density desired, among other factors.

Figure 6:
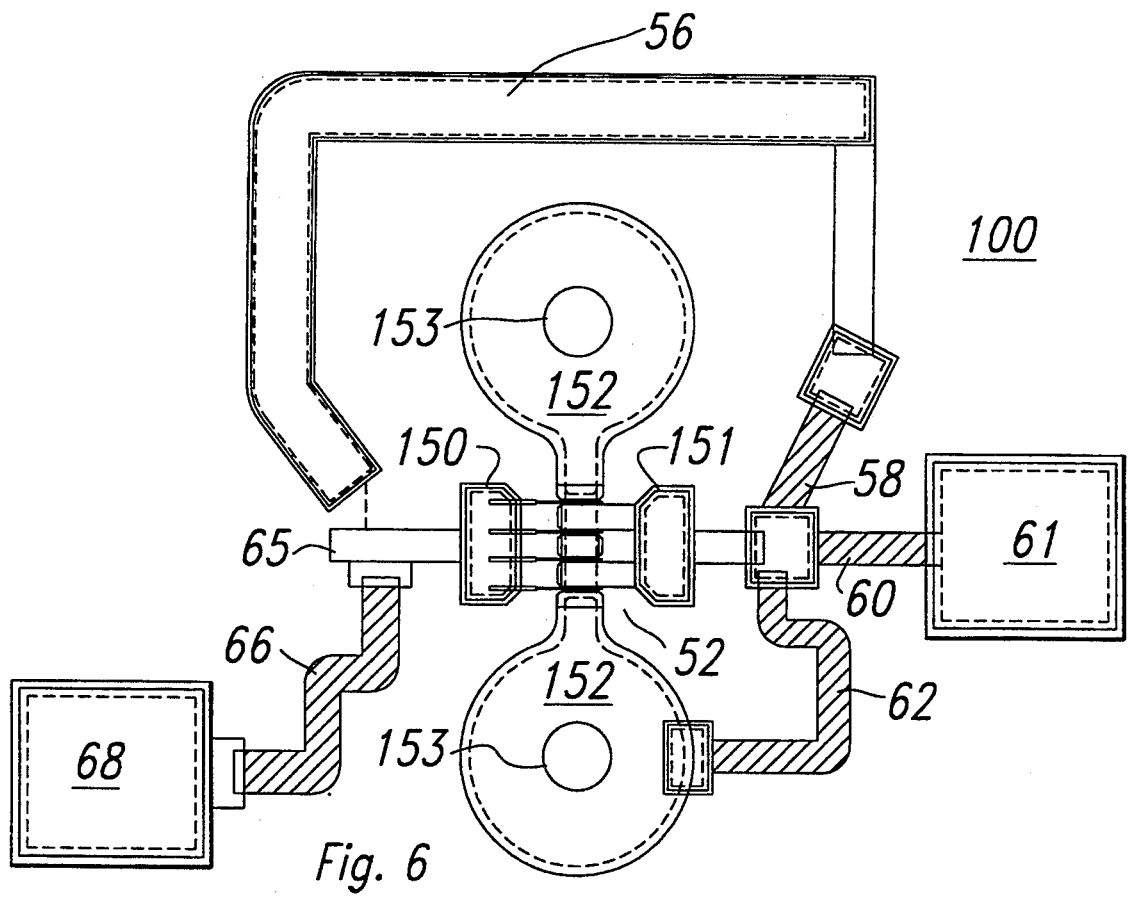
FIGS. 6 and 7 are plan views of monolithic implementations of active terminations.

A layout sketch of an embodiment of the terminating circuit 50 is shown in FIG. 6. Note that the elements of circuit 50 shown in FIG. 3 are present in the layout sketch of FIG. 6. FIG. 6 also includes a gate bias network which includes resistor 66 and bias node 68 of the circuit of FIG. 3. The connection of the transistor source 152 and resistor 62 to ground is accomplished in FIG. 6 by vias 153. Resistors 58, 60, and 62 are typically composed of a thin film such as TaN or NiCr, for example. In this embodiment, resistor 66 is formed of semiconductor material. This may be done with ion implantation into the GaAs substrate 100, or alternatively with a portion of an active epitaxial layer (within the pHEMT material structure, for example). Thin film or implanted resistors are suitable for all of the resistors shown, depending on size and space constraints. In general, low value or precision resistors are more suitably fabricated with thin film material, while high valued resistors are more easily made with semiconductor material. Both processes are standard in the industry. Capacitor 56 is of the metal-insulator-metal type, and has an approximately 2000 Å $Si_3N_4$ insulator layer.

Figure 7:
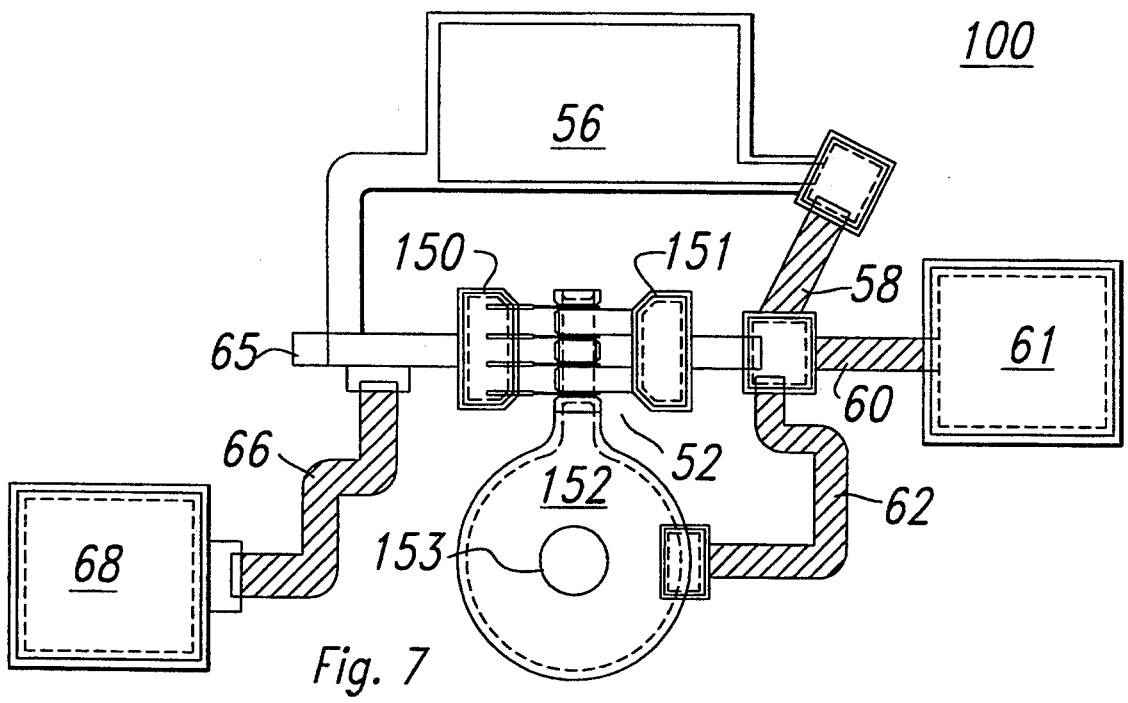
Figure 8:
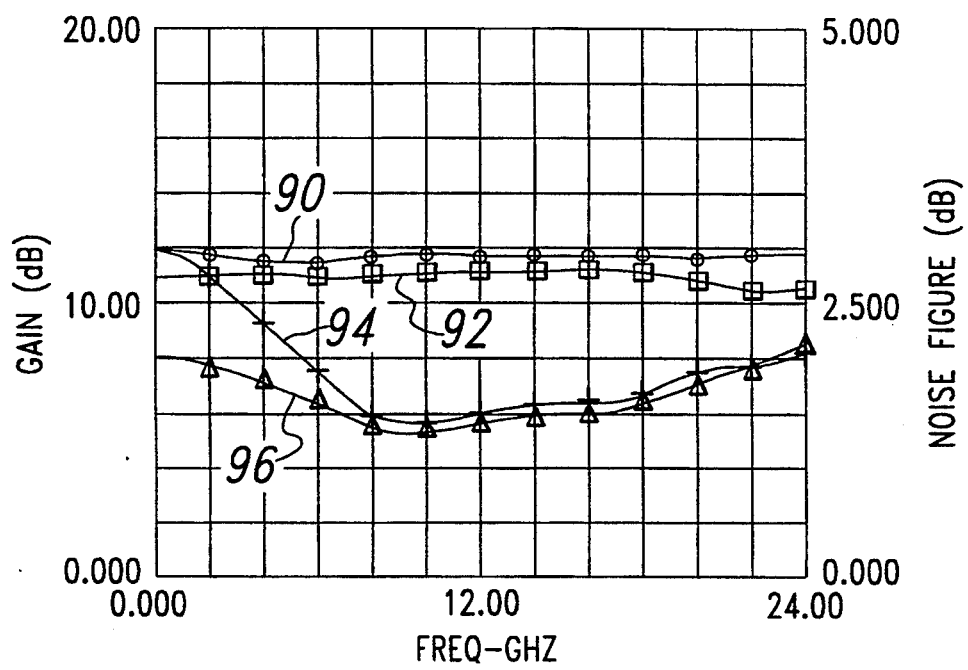
FIG. 8 is a graph of gain and noise figure for a prior art amplifier and a preferred embodiment amplifier.

Another embodiment of terminating circuit 50, fabricated on substrate 100, is shown in FIG. 7. In this configuration, transistor source 152 is grounded through via 153 at only one point on the substrate, compared to two in FIG. 6. This allows the feedback loop, which includes resistor 58 and capacitor 56, to be made physically smaller and shorter, thereby lessening inductance in the loop. In these embodiments, transistor 52 has a gate periphery of approximately 100 um and is biased with a gate voltage in a range of approximately $-2$ V to 0.5 V. A drain voltage and current of approximately 3 V and 3.3 mA is typically used.

The expected performance of the circuit of FIG. 5 has been modeled and plotted in FIG. 6 where trace 90 is the gain of a distributed amplifier with an active termination (as in FIGS. 2,3, and 5), and trace 92 is the gain of a prior art passively terminated distributed amplifier. Note that the gain is slightly higher across the entire dc-24 GHz bandwidth. However, the noise figure trace 94 for the actively terminated amplifier indicates significantly better performance than does the prior art passively terminated circuit's noise figure trace 96, particularly at frequencies below 6 GHz. It is a surprising aspect of the embodiments described herein that the noise figure of an amplifier which incorporates a certain type of transistor as an amplifying element may be lowered with a terminating circuit which incorporates the same type of transistor, each transistor being fabricated with the same process steps.

A few preferred embodiments have been described in detail hereinabove. It is to be understood that the scope of the invention also comprehends embodiments different from those described, yet within the scope of the claims. The circuit may be implemented in a monolithic or hybrid form. It may be constructed in a GaAs, InP, Si or other suitable semiconductor substrate. The FET elements may be formed with ion implantation or epitaxial processes such as molecular beam epitaxy or organo-metallic vapor phase epitaxy. The invention should be operable with virtually any transistor type of a generally low-noise performance characteristic including ion implanted and epitaxial MESFETs, pseudomorphic HEMTs, and heterojunction bipolar transistors, as well as transistors fabricated in Si.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier comprising:
    a) an input transmission line;
    b) an output transmission line;
    c) at least two active devices distributed between said two transmission lines;
    d) a termination coupled to an end of said input transmission line, wherein said termination is dc isolated from said input transmission line, and further wherein said termination is biased independently of said active devices distributed between said two transmission lines.

2. The amplifier of claim 1 wherein said termination is characterized by a noise temperature of less than 300° K.

3. The amplifier of claim 1 wherein said output transmission line is coupled to a passive termination.

4. The amplifier of claim 1 wherein said termination has an impedance of approximately 50 ohms.

5. The amplifier of claim 1 wherein said termination has a noise temperature of approximately 200 K.

6. The amplifier of claim 1 wherein at least two of said active devices have unequal gate peripheries.

7. A monolithic distributed amplifier comprising:
    a) a semiconductor substrate having a top surface;
    b) at least two first field effect transistors formed at said top surface, said first transistors each having a first gate terminal, a first drain terminal, and a first source terminal;
    c) an input transmission line formed on said top surface, said input transmission line coupling an input terminal and a first termination, said first termination comprising a terminating transistor formed at said top surface and having a second gate terminal, a second drain terminal, and a second source terminal, wherein said second gate terminal is coupled to said input transmission line and said second drain terminal is coupled to said second gate terminal through resistive and capacitive elements, and further wherein said first gate terminals and said second gate terminal are biased independently;

d) an output transmission line formed on said top surface, said output transmission line coupling an output terminal and a second termination; wherein said output transmission line is coupled to said first drain terminals, and said input transmission line is coupled to said first gate terminals.

8. The distributed amplifier of claim 7 wherein said first termination is characterized by a noise temperature of less than 300° K.

9. The distributed amplifier of claim 7 wherein said semiconductor substrate is GaAs.

10. The distributed amplifier of claim 7 wherein said first termination has an impedance of approximately 50 ohms.

11. The distributed amplifier of claim 7 wherein said first termination has a noise temperature of approximately 200° K.

12. The distributed amplifier of claim 7 wherein each of said field effect transistors has a different gate periphery.

13. The distributed amplifier of claim 7 wherein said terminating transistor has a gate periphery in the range of approximately 50 um to 200 um.

14. A method for fabricating a monolithic amplifier comprising:

a) forming an input transmission line;

b) forming an output transmission line;

c) forming at least two field effect transistors distributed between said two transmission lines, said field effect transistors each having a first gate terminal; and d) forming a termination coupled to an end of said input transmission line, said termination comprising a field effect transistor having a second gate terminal, a drain terminal, and a source terminal, wherein said second gate terminal is coupled to said input transmission line and said drain terminal is coupled to said second gate terminal through resistive and capacitive elements, and further wherein first and second gate terminals are biased independently.

15. The method of claim 14 wherein said termination is characterized by a noise temperature of less than 300° K.

16. The method of claim 14 wherein said termination has an impedance of approximately 50 ohms.

17. The method of claim 14 wherein said termination has a noise temperature of approximately 200 K.

18. The method of claim 14 wherein said field effect transistors distributed between said two transmission lines have unequal gate peripheries.

19. The method of claim 14 wherein said field effect transistors distributed between said two transmission lines and said termination comprising a field effect transistor are fabricated simultaneously.

20. The method of claim 14 wherein said field effect transistors distributed between said two transmission lines and said field effect transistor in said termination are HEMTs.

* * * * *